(12) United States Patent
Howard et al.

(10) Patent No.: US 8,189,340 B2
(45) Date of Patent: May 29, 2012

(54) MOBILE DIGITAL VIDEO RECORDER

(75) Inventors: Richie Howard, Newton, AL (US);
Chao-Lin Tang, Miaoli (TW)

(73) Assignee: IVS, Inc., Newton, AL (US)

( * ) Notice: Subject to any disclaimer, the term of this patent is extended or adjusted under 35 U.S.C. 154(b) by 427 days.

(21) Appl. No.: 12/457,878

(22) Filed: Jun. 24, 2009

(65) Prior Publication Data
US 2010/0328855 A1 Dec. 30, 2010

(51) Int. Cl.
*H05K 5/00* (2006.01)
(52) U.S. Cl. .................. 361/752; 361/730; 361/800
(58) Field of Classification Search .............. 361/728, 361/730, 752, 796, 800
See application file for complete search history.

(56) References Cited

U.S. PATENT DOCUMENTS

| | | | |
|---|---|---|---|
| 4,807,031 A | 2/1989 | Broughton et al. | |
| 5,443,227 A | 8/1995 | Hsu | |
| 5,467,274 A | 11/1995 | Vax | |
| 5,761,033 A * | 6/1998 | Wilhelm | 361/679.33 |
| 5,912,799 A * | 6/1999 | Grouell et al. | 361/679.32 |
| 6,023,241 A | 2/2000 | Clapper | |
| 6,038,126 A * | 3/2000 | Weng | 361/679.01 |
| 6,061,250 A * | 5/2000 | Lavan | 361/797 |
| 6,094,228 A | 7/2000 | Ciardullo et al. | |
| 6,188,939 B1 | 2/2001 | Morgan et al. | |
| 6,229,572 B1 | 5/2001 | Ciardullo et al. | |
| 6,247,950 B1 * | 6/2001 | Hallam et al. | 439/267 |
| 6,301,123 B1 * | 10/2001 | Nealis et al. | 361/798 |
| 6,388,873 B1 * | 5/2002 | Brooks et al. | 361/679.34 |
| 6,472,771 B1 | 10/2002 | Frese et al. | |
| 6,530,782 B2 | 3/2003 | Fouse et al. | |
| 6,594,150 B2 * | 7/2003 | Creason et al. | 361/727 |
| 6,661,905 B1 | 12/2003 | Chupp et al. | |
| 6,681,160 B2 | 1/2004 | Bidaud | |
| 6,720,879 B2 | 4/2004 | Edwards | |
| 6,741,790 B1 | 5/2004 | Burgess | |
| 7,097,477 B1 * | 8/2006 | Felton et al. | 439/157 |
| 7,155,336 B2 | 12/2006 | Dorman et al. | |
| 2002/0016674 A1 | 2/2002 | Rudow et al. | |
| 2002/0045987 A1 | 4/2002 | Ohata et al. | |
| 2002/0112250 A1 | 8/2002 | Koplar et al. | |

(Continued)

FOREIGN PATENT DOCUMENTS

JP 2002-330377 11/2002

OTHER PUBLICATIONS

Written Opinion and Search Report for International Application No. PCT/US04/26855 (Nov. 27, 2006).

(Continued)

*Primary Examiner* — Hung S Bui
(74) *Attorney, Agent, or Firm* — Jacobson Holman PLLC

(57) ABSTRACT

A mobile digital video recorder (MDVR) has a hollow shell, two board tracks, two brackets, a main board, power board, VSM board, and a storage device. The board tracks and the brackets are attached securely in the shell. The main board is mounted slidably and detachably in the shell via the tracks. The power board is mounted slidably and detachably in the shell via the tracks. The VSM board is mounted slidably and detachably in the shell via the tracks. The storage device is mounted slidably and detachably in the shell via the brackets. Therefore, the main board, power board, VSM board and the storage device are easily pulled out from the shell for repairing, replacing, or upgrading to new technology.

15 Claims, 9 Drawing Sheets

U.S. PATENT DOCUMENTS

| | | | |
|---|---|---|---|
| 2002/0183102 | A1 | 12/2002 | Withers et al. |
| 2003/0087635 | A1 | 5/2003 | Sheffield |
| 2004/0117856 | A1 | 6/2004 | Barsoum et al. |
| 2010/0328911 | A1* | 12/2010 | Tang .............................. 361/756 |

OTHER PUBLICATIONS

International Preliminary Report on Patentability (Jan. 18, 2007).
International Search Report and Written Opinion (Nov. 27, 2006).

* cited by examiner

MOBILE DIGITAL VIDEO RECORDER

BACKGROUND OF THE INVENTION

1. Field of the Invention

The present invention relates to a mobile digital video recorder (MDVR), especially to a MDVR that has removable devices.

2. Description of the Prior Art

Public transport such as a bus or any other moving vehicle, including but not limited to trains, trucks, elevators, or powered equipment may have mobile digital video recorders (MDVR) to record the travel history so that when a traffic accident or incident inside or outside the vehicle occurs, the progress of the traffic accident or incident may be recorded. To record images, the conventional MDVR has a main board for processing the signals, a power supply board, and a hard drive or other digital storage device to store the images and other pertinent data including but not limited to audio and video. The main board, power supply board, and the hard drive and other components are mounted securely in a shell for protection. However, when the main board, power supply board, and the hard drive or other components are broken or have failed, the shell must be taken apart to remove the main board and the hard drive or other components for repair. Taking the shell apart is difficult and time consuming and is not convenient for the user to repair the main board, power supply board, and the hard drive or other components. In almost all cases the entire MDVR must be removed from the vehicle to accomplish repairs. This is difficult for the owner or user of the MDVR. In addition, upgrading to new technology requires the conventional MDVR to be removed from the vehicle and returned to the factory for the technology upgrade. To overcome the shortcomings, the present invention provides a mobile digital video recorder to mitigate or obviate the aforementioned problems.

SUMMARY OF THE INVENTION

The main objective of the present invention is to provide a mobile digital video recorder (MDVR) that is easily repaired or upgraded to new technology, without removing the MDVR from the vehicle. The MDVR has a hollow shell, two board tracks, two brackets, a main board, power board, optional VSM board, and a storage device. The board tracks and the brackets are attached securely in the shell. The main board is mounted slidably and detachably in the shell via the tracks. The power board is mounted slidably and detachably in the shell via the tracks. The VSM board is mounted slidably and detachably in the shell via the tracks. The storage device is mounted slidably and detachably in the shell via the tracks. Therefore, the main board, power board, VSM board and the storage device are easily pulled out from the shell for repairing and replacement. The design need not be a box like configuration. Other designs such as round, circular, or orbital, or trapezoidal may be employed. The order of the slidable boards may be in other orders than described here, and the boards need not be vertically stacked. Horizontal, or side by side configurations may be utilized as well. The functionality the boards may be combined to reduce the number of boards and additional boards may be added to the concept to perform new desirable functions.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
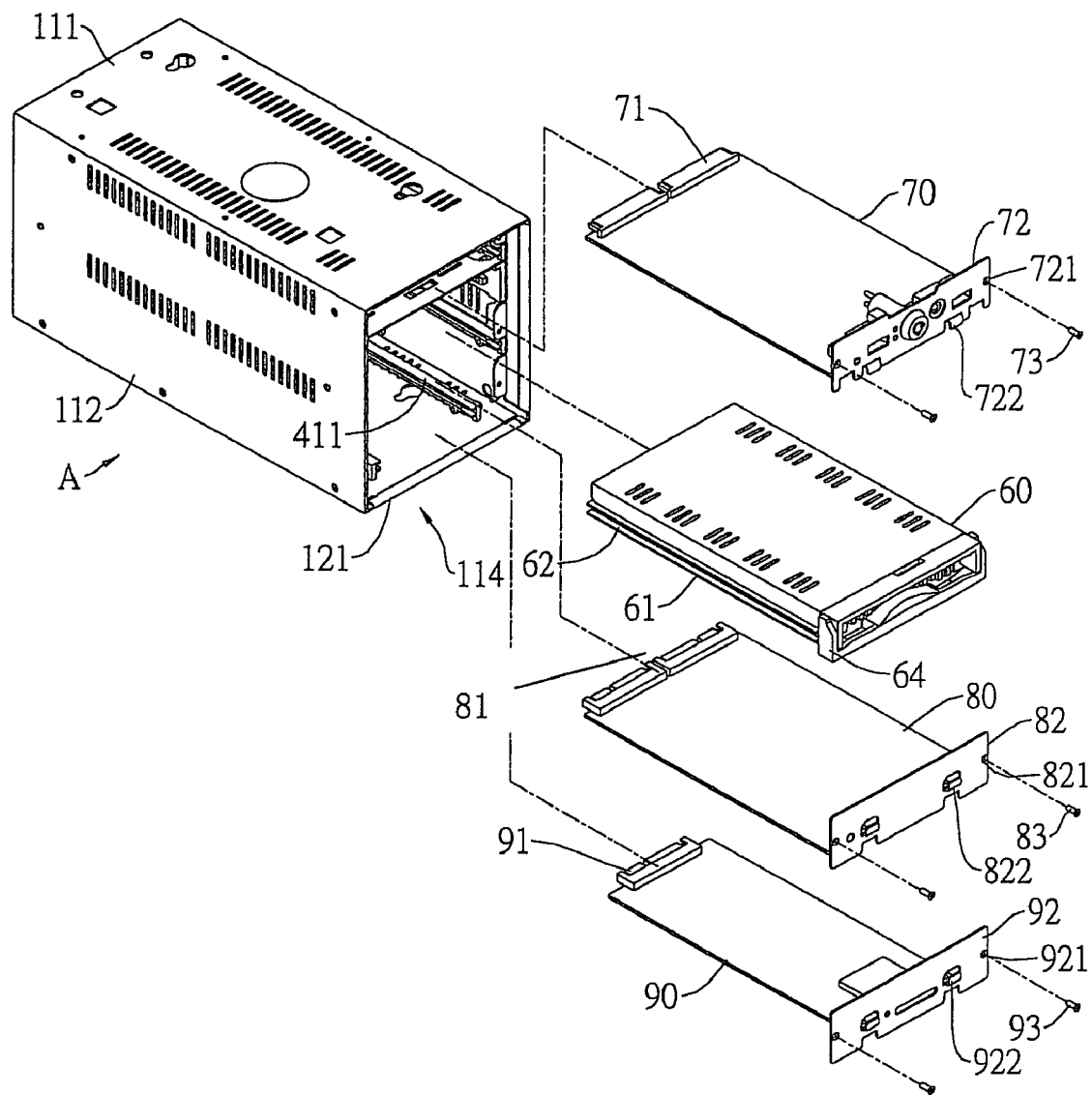
FIG. 1 is an exploded perspective view of the mobile digital video recorder (MDVR) in accordance with the present invention.
Figure 2:
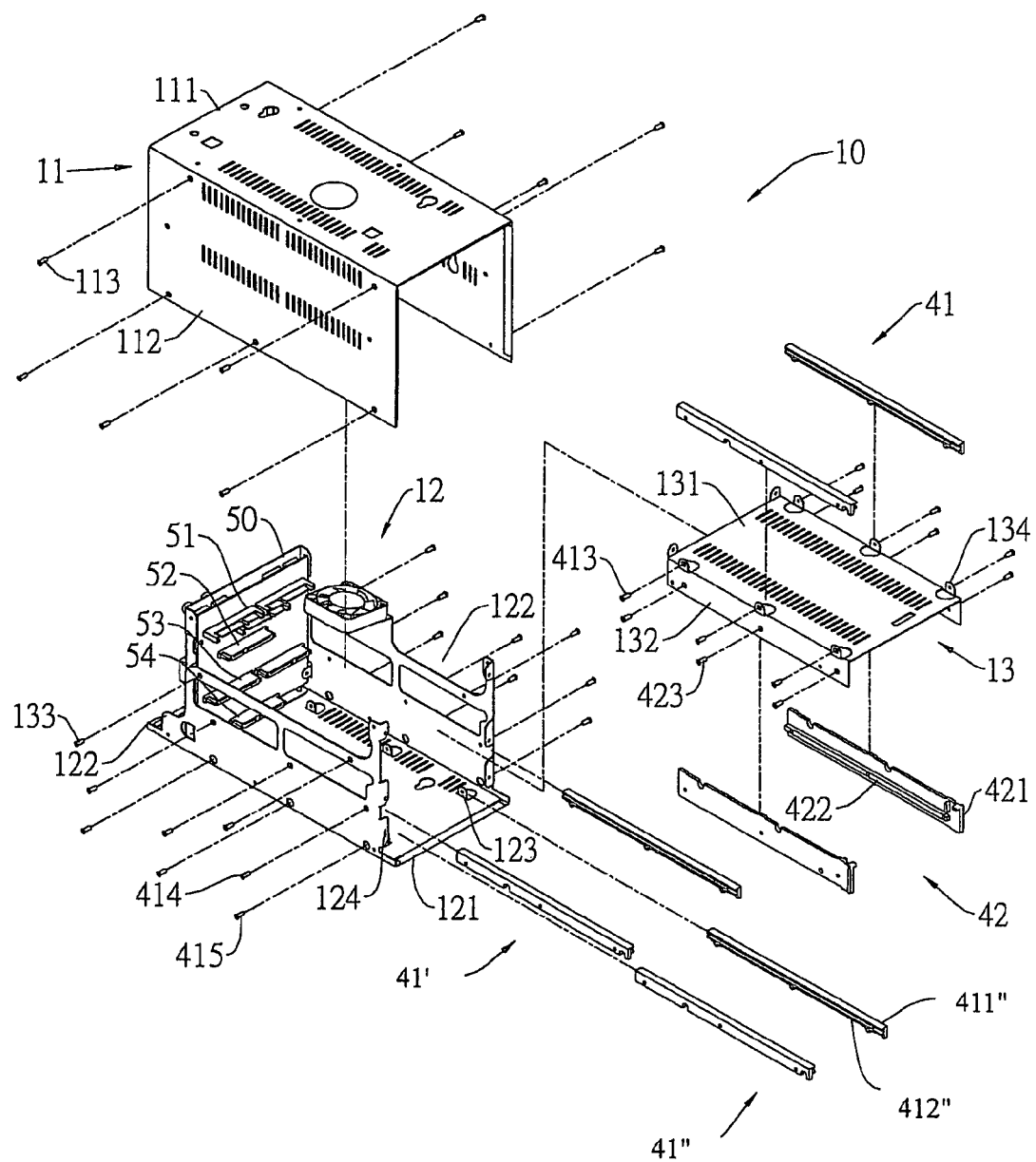
FIG. 2 is an exploded perspective view of the shell, the track assemblies and the rail assembly of the MDVR in FIG. 1.
Figure 3:
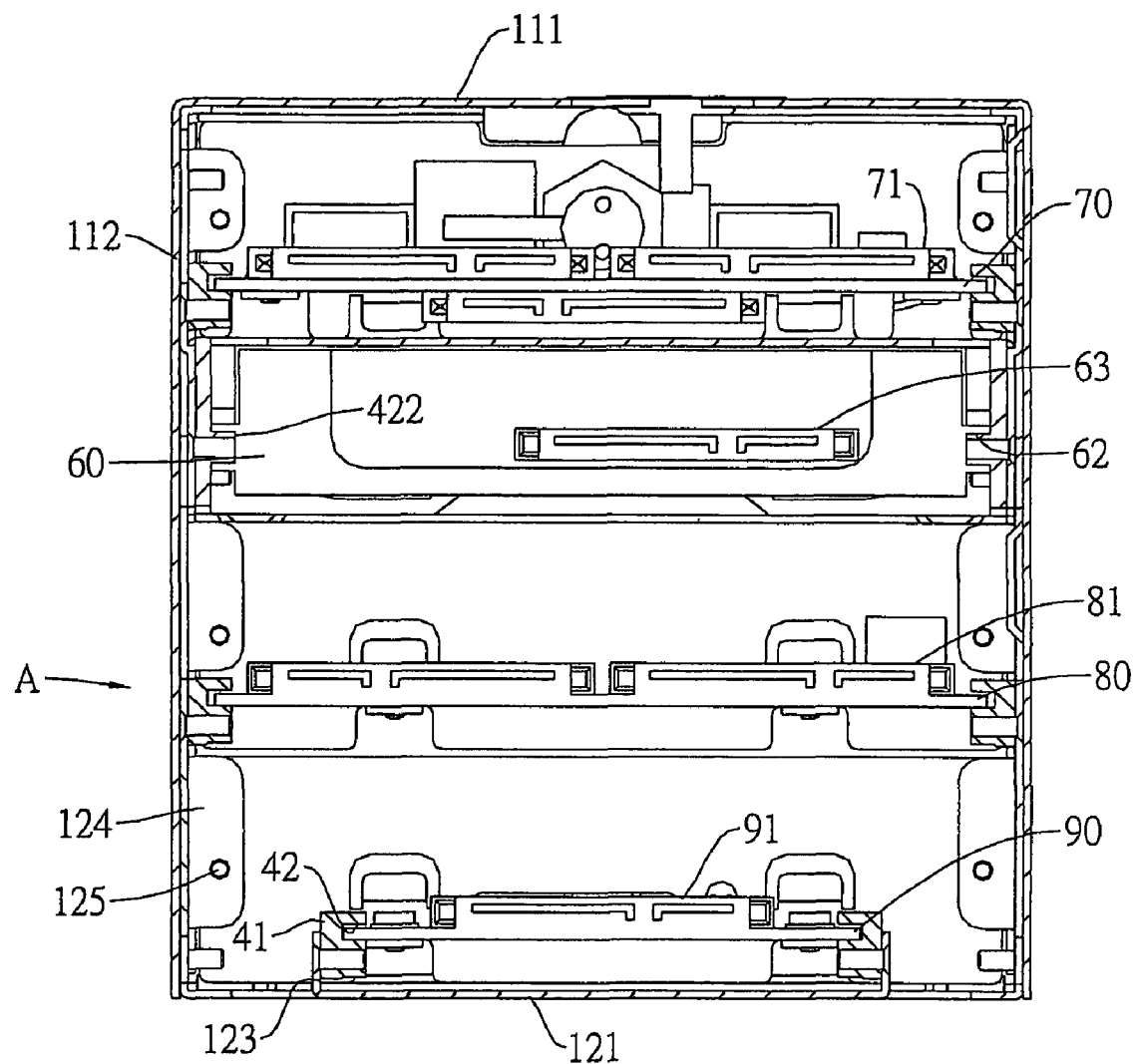
FIG. 3 is a side view in partial section of the MDVR in FIG. 1.

With reference to FIGS. 1 to 3, the mobile digital video recorder (MDVR) in accordance with the present invention comprises a hollow shell (A), a board track assembly (41), a power track assembly (41'), a module track assembly (41"), a rail assembly (42), a signal converting board (50), a storage device (60), a main board (70), a power board (80) and a virtual synchronized mapping module (90).

Figure 9:
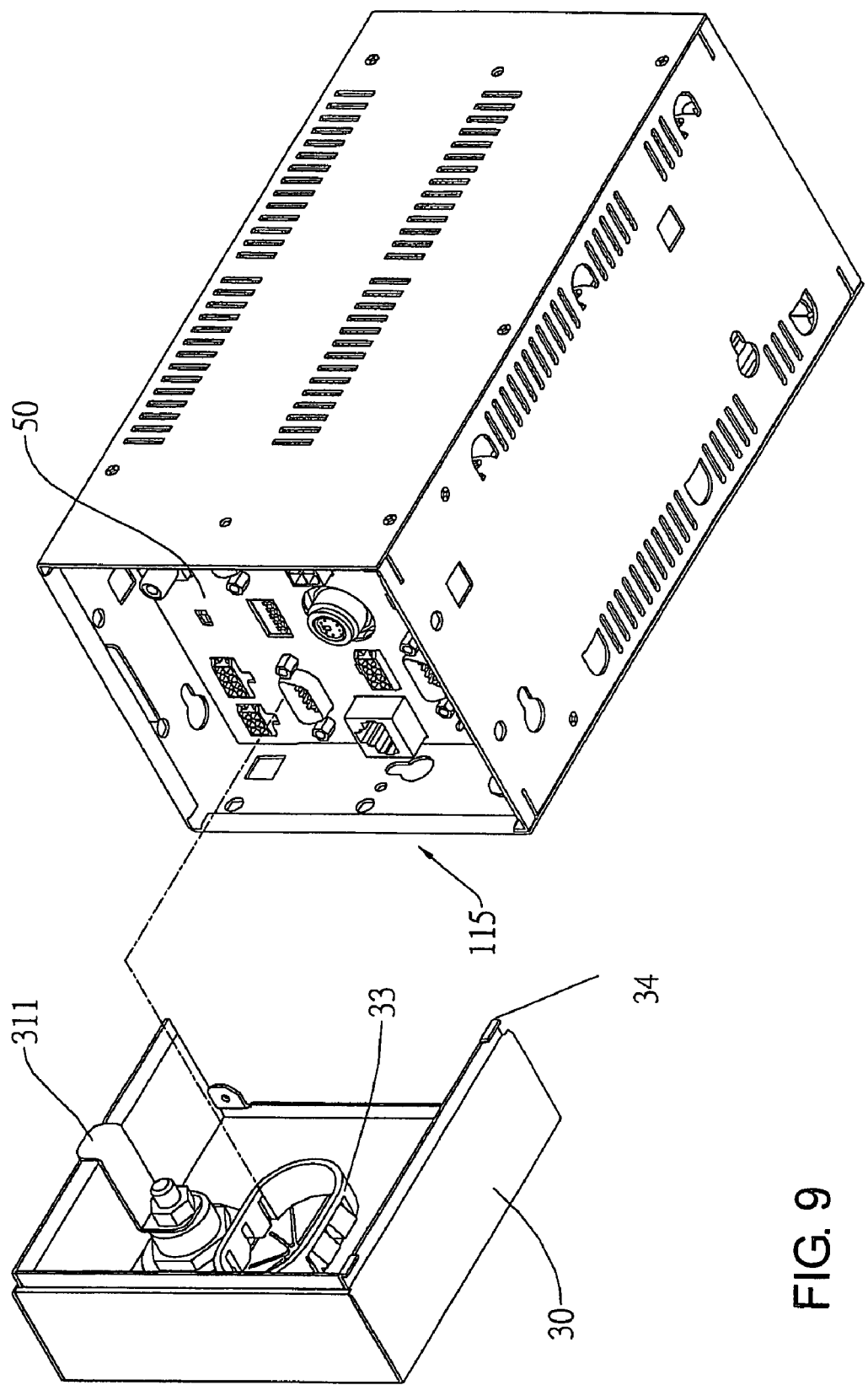
FIG. 9 is another exploded perspective view of the MDVR in FIG. 1.

With further reference to FIG. 9, the shell (A) comprises a body (10), a front opening (114) and a rear opening (115). The body (10) has a lower casing (12), an upper casing (11) and an inner casing (13). The lower casing (12) has a bottom panel (121) and two inner side panels (122) formed on two sides of the bottom panel (121). Multiple bosses (123) are formed on the bottom panel (121) and are disposed at two rows. The upper casing (11) is mounted above the lower casing (12) and has a top panel (111) and two outer side panels (112) formed on two sides of the top panel (111). The outer side panels (112) are attached respectively to outer sides of the inner side panels (122) by fasteners (113). The inner casing (13) is mounted between the upper and lower casings (11, 12) and has a partition (131) and two side wings (132) formed on two sides of the partition (131). The side wings (132) are attached respectively to inner sides of the inner side panels (122) by fasteners (133). Multiple bosses (134) are formed between the partition (131) and the side wings (132).

The track assemblies (41, 41', 41") are mounted securely in the shell (A). Each track assembly (41, 41', 41") has two tracks (411, 411', 411") being opposite to each other. The tracks (411) of the board track assembly (41) are attached securely to the inner casing (13) via fasteners (413). The tracks (411') of the power track assembly (41') are attached securely to the inner side panels (122) via fasteners (414). The tracks (411") of the module track assembly (41") are attached securely to the bosses (123) of the lower casing (12) via fasteners (415). Each track (411, 411', 411") has an elongated channel (412).

The rail assembly (42) is mounted securely in the shell (A), and has two brackets (421) being opposite to each other. Each bracket (421) may be attached securely to the side panels (132) of the inner casing (13) via fasteners (423) and has an elongated rib (422).

With further reference to FIG. 9, the signal converting board (50) is mounted in the rear opening (115) of the shell (A) and has a board socket group (51), a storage device socket group (52), a power socket group (53) and a module socket group (54). The socket groups (51, 52, 53, 54) are formed on inner side of the signal converting board (50) and respectively correspond to the track assemblies (41, 41', 41") and the rail assembly (42). Multiple connectors are formed on outer side of the signal converting board (50) for connecting external devices such as power, camera, screen and the like.

The storage device (60) is mounted slidably and detachably in the shell (A). The storage device (60) may be a hard drive or the like and has two pairs of flanges (61) formed respectively on two sides of the storage device (60). Two recesses (62) are defined respectively between the pairs of flanges (61) and respectively engage the elongated ribs (422) of the brackets (421) to slide the storage device (60) along the rail assembly (42). The storage device (60) has a plug (63) formed on a rear end thereof and inserted into the storage device socket group (52) to transmit the signal. A handle (64) is mounted pivotally to a front end of the storage device (60) for easily pull the storage device (60).

The main board (70) is used for signal processing, may be also used for power converting, is mounted slidably and detachably in the shell (A) and is mounted slidably in the channels (412) of the tracks (411) of the board track assembly (41). The main board (70) has a plug (71) formed on a rear end thereof and inserted in to the board socket group (51) to transmit the signal. The main board (70) has a front panel (72).

The power board (80) is used for power converting, is mounted slidably and detachably in the shell (A) and is mounted slidably in the channels (412') of the tracks (411') of the power track assembly (41'). The power board (80) has a plug (81) formed on a rear end thereof and inserted in to the power socket group (53). The power board (80) has a front panel (82). The power board (80) has power converting circuit thereon. The power converting circuit may be formed on the main board (70).

The virtual synchronized mapping module (90) is used for receiving global positioning signal, is mounted slidably and detachably in the shell (A) and is mounted slidably in the channels (412") of the tracks (411") of the module track assembly (41"). The virtual synchronized mapping module (90) has a plug (91) formed on a rear end thereof and inserted in to the module socket group (54) to transmit the signal. The virtual synchronized mapping module (90) has a front panel (92).

With reference to FIGS. 2 and 3, the side panels (122) of the lower casing (12) may have multiple ears (124) with screw holes (125). The front panels (72, 82, 92) are attached securely to the ears (124) via screws (72, 82, 92) to position the main board (70), the power board (80) and the virtual synchronized mapping module (90) more securely.

Figure 4:
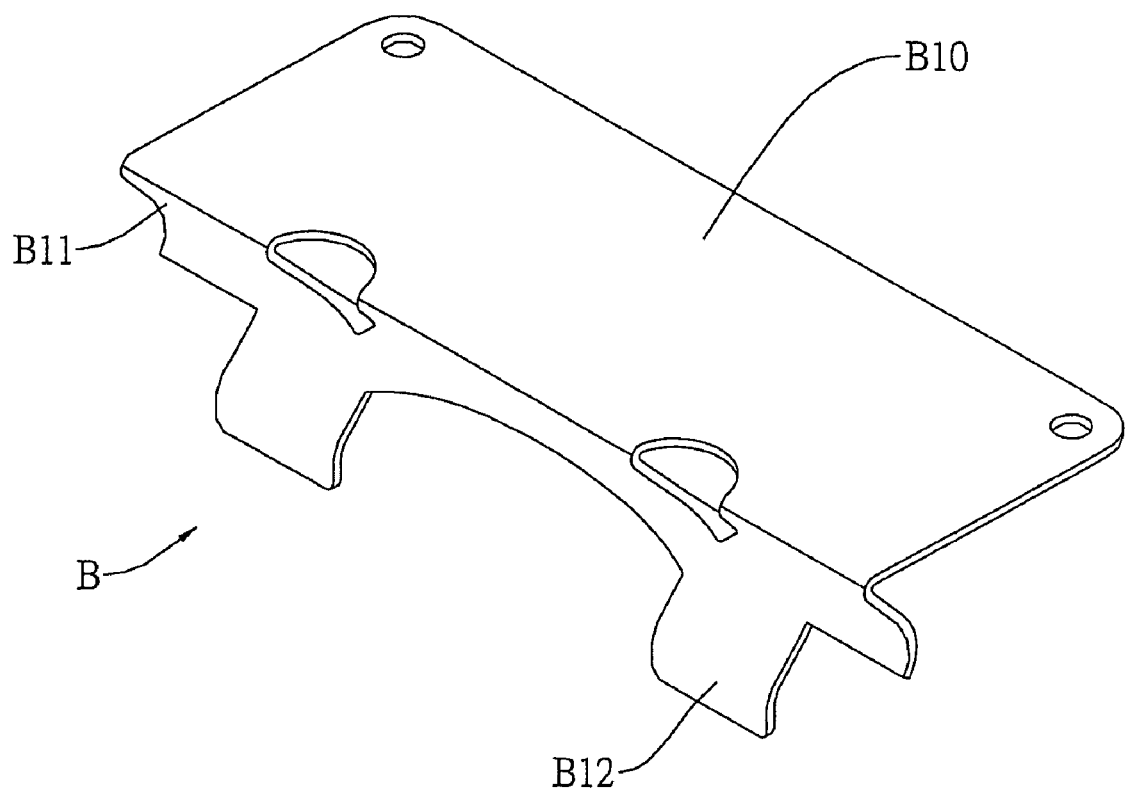
FIG. 4 is a perspective view of the grip of the MDVR in FIG. 1.
Figure 5:
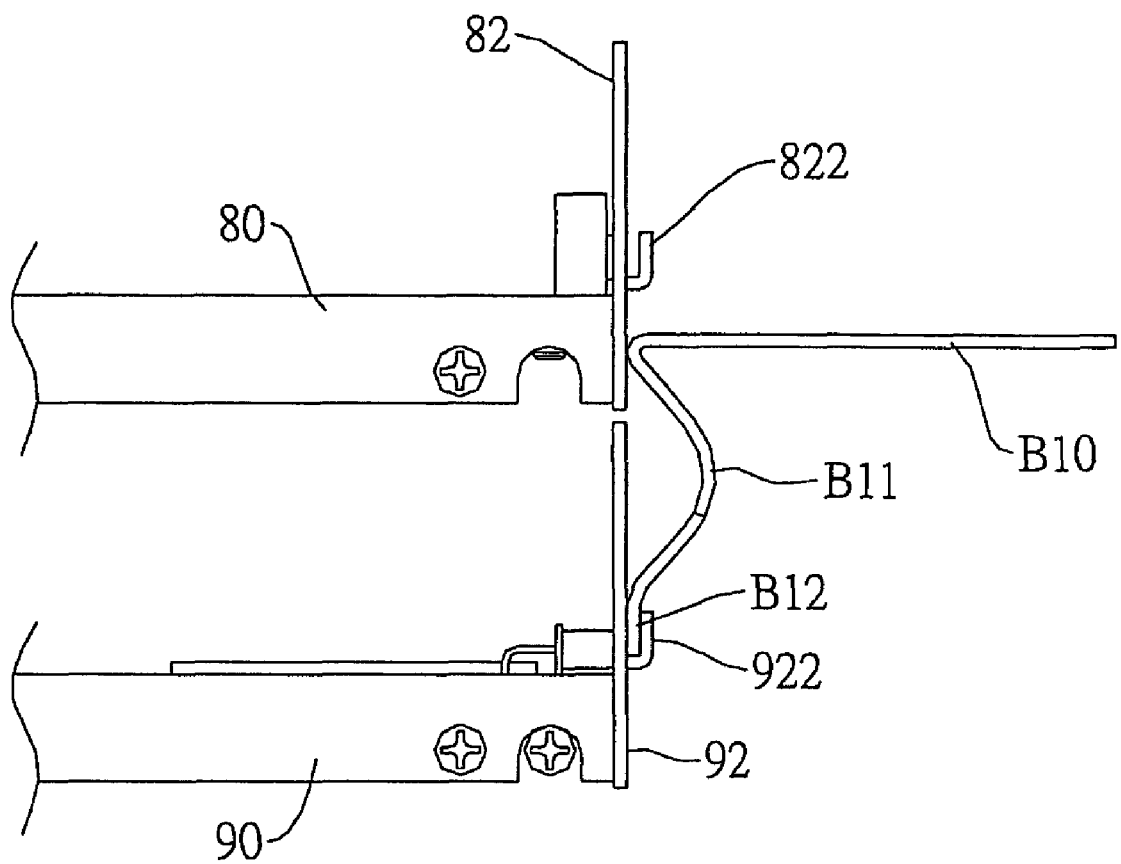
FIG. 5 is an operational side view of the MDVR in FIG. 1.
Figure 6:
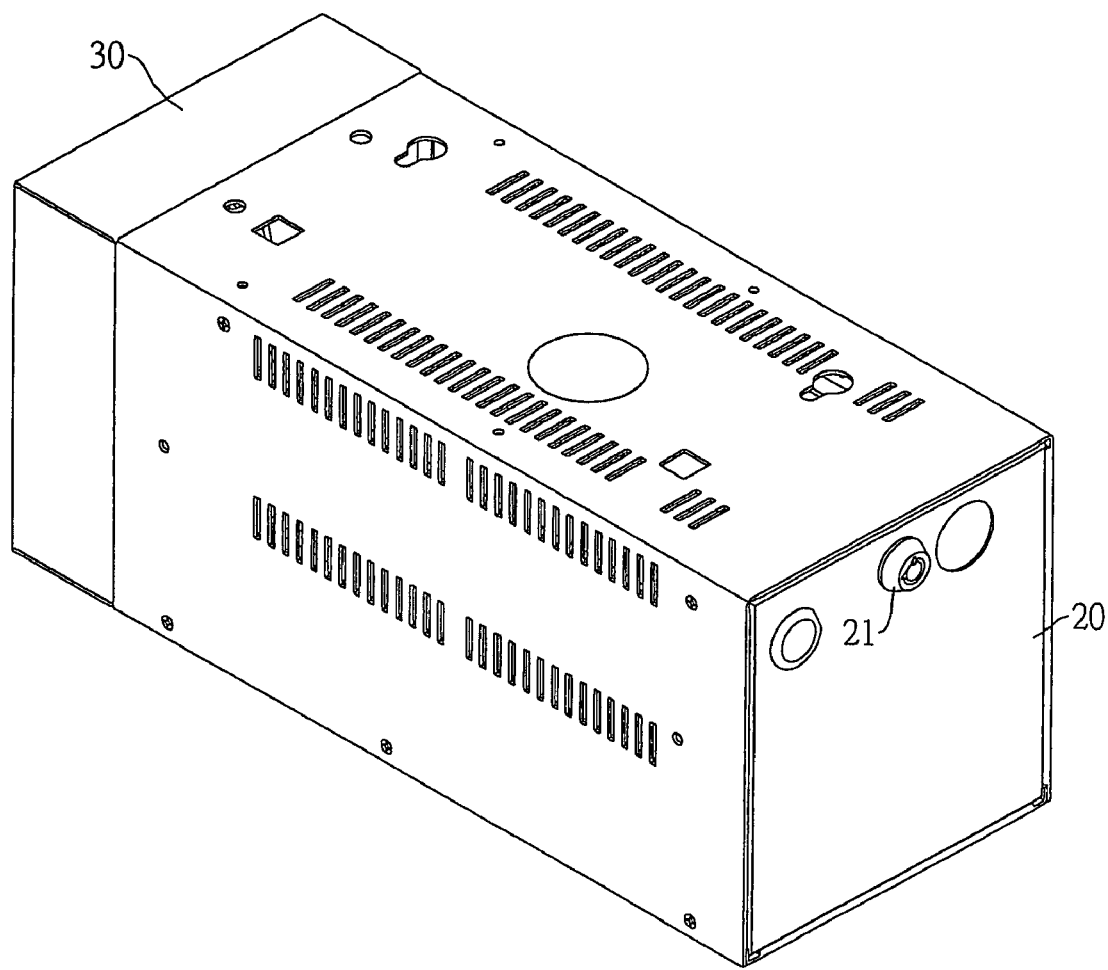
FIG. 6 is a perspective view of the MDVR in FIG. 1.
Figure 7:
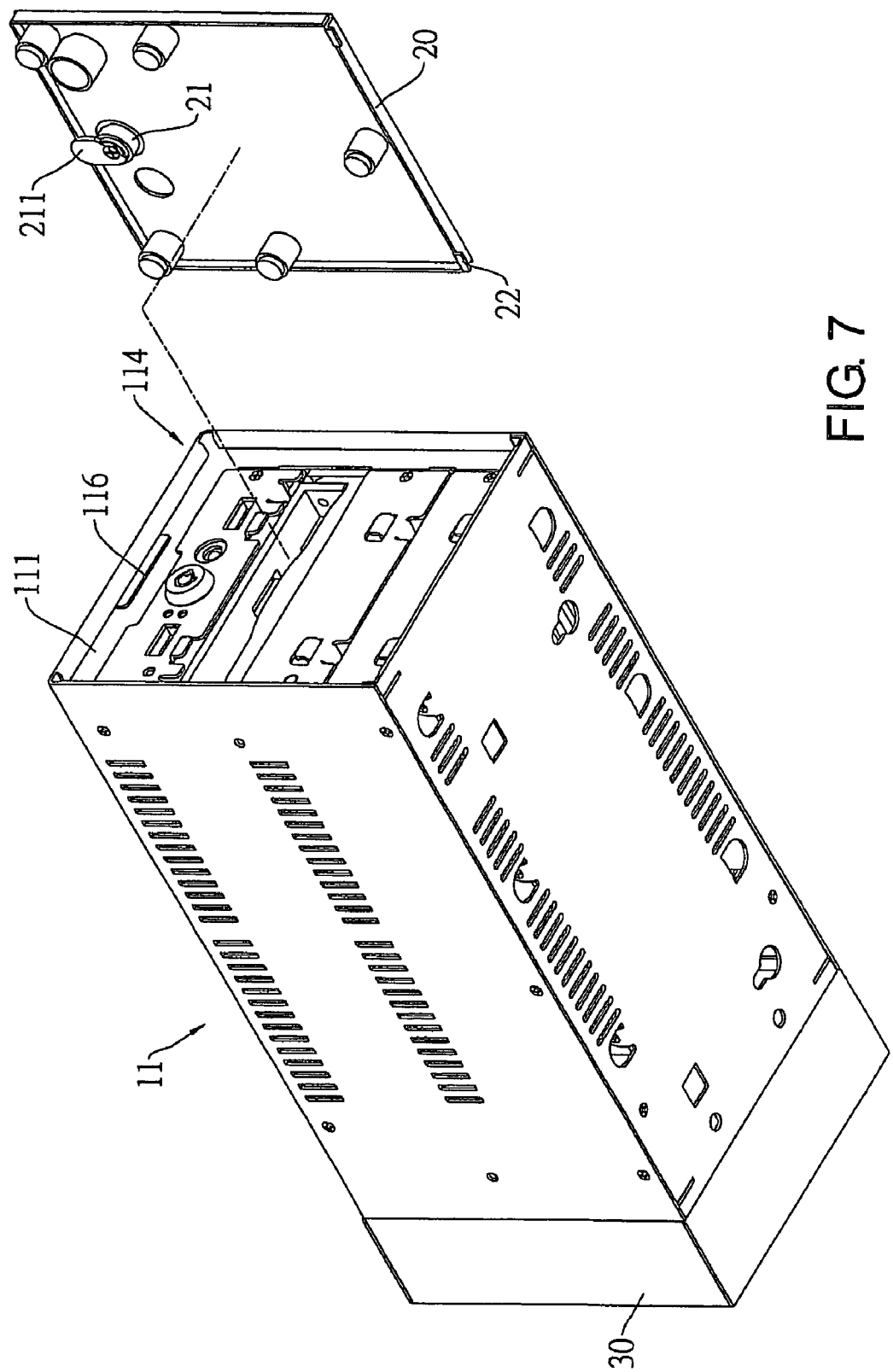
FIG. 7 is an exploded perspective view of the MDVR in FIG. 1.
Figure 8:
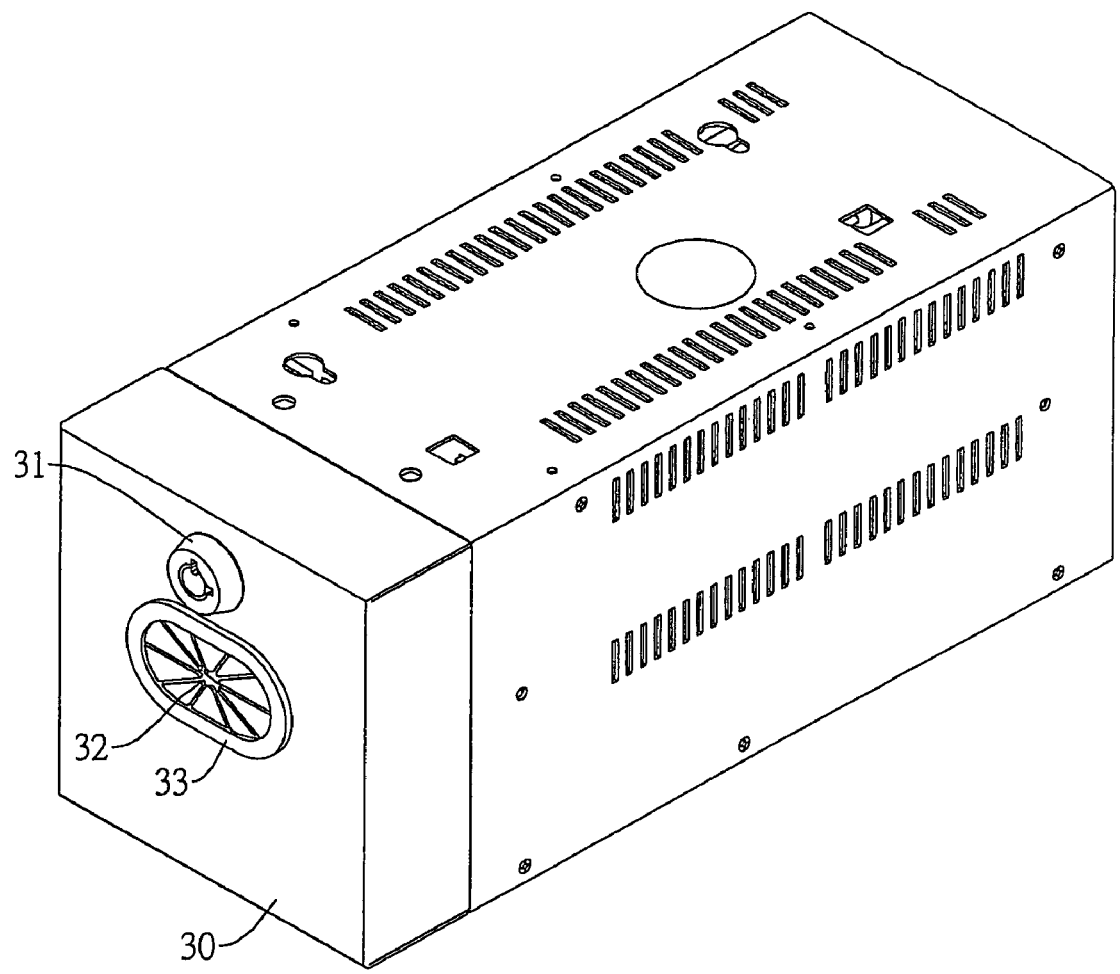
FIG. 8 is another perspective view of the MDVR in FIG. 1.

With reference to FIGS. 4 and 5, a grip (B) is used to conveniently detach the main board (70), the power board (80) and the virtual synchronized mapping module (90) out of the shell (A). The grip (B) has a holder (B10), a connecting part (B11) and two projections (B12). The connecting part (B11) is formed between the holder (B10) and the projections (B12). The front panels (72, 82, 92) may have protrusions (722, 822, 922). When the user wants to detach the main board (70), the power board (80) and the virtual synchronized mapping module (90) from the shell (A), the projections (B12) hooks the protrusions (722, 822, 922) to pull the main board (70), the power board (80) and the virtual synchronized mapping module (90) out of the shell (A).

With reference to FIGS. 6 to 9, the shell (A) may have a front cover (20) and a rear cover (30) to protect the components in the body (10). The front cover (20) covers the front opening (114) of the shell (A) and has a lock (21) with a tongue (211) driven by the lock (21) and a protrusion (22) connecting to the body (10). The tongue (211) hooks a front sheet (116) extending from the top panel (111) to secure the front cover (20) to the body (10). The rear cover (30) covers the signal converting board (50) and has a lock (31) with a tongue (311) driven by the lock (31) and a protrusion (34) connecting to the body (10). The tongue (311) hooks a rear sheet (117) extending from the top panel (111) to secure the rear cover (30) to the body (10). The rear cover (30) has an opening (32) and a ring (33). The ring (33) is mounted around the opening (32) of the rear cover (30) and has multiple resilient segments extending into the opening (32) to hold the wires protruding therethrough.

The MDVR as described has following advantages. The storage device (60), the main board (70), the power board (80) and the (VSM) virtual synchronized mapping module (90) are easily detached from the shell (A) without taking the shell (A) apart because of the track assemblies (41, 41', 41") and the rail assembly (42). Therefore, it is convenient for users to repair the storage device (60), the main board (70), the power board (80) and the virtual synchronized mapping module (90) by simply pull them out of the shell (A). The assembling and disassembling time for the storage device (60), the main board (70), the power board (80) and the virtual synchronized mapping module (90) is also reduced. Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:
1. A mobile digital video recorder comprising:
a hollow shell having a front opening and a rear opening;
a board track assembly mounted securely in the shell and having two tracks being opposite to each other, and each track having an elongated channel;
a rail assembly mounted securely in the shell and having two brackets being opposite to each other, each bracket having an elongated rib;
a signal converting board mounted in the rear opening of the shell and having a board socket group formed on an inner side of the signal converting board and corresponding to the board track assembly;
a storage device socket group formed on an inner side of the signal converting board and corresponding to the rail assembly;
a storage device mounted slidably and detachably in the shell and having two pairs of flanges formed respectively on two sides of the storage device; two recesses defined respectively between the pairs of flanges and respectively engaging the elongated ribs of the brackets to slide the storage device along the rail assembly;
a plug formed on a rear end of the storage device and inserted into the storage device socket group;
a main board for signal processing and power converting mounted slidably and detachably in the shell, mounted slidably in the channels of the tracks of the board track assembly and having a plug formed on a rear end of the main board and inserted into the board socket group a module track assembly mounted securely in the shell and having two tracks being opposite to each other, each track or the module track assembly having an elongated channel;

a module socket group formed on an inner side of the signal converting board and corresponding to the module track assembly;

a virtual synchronized mapping module for receiving global positioning signals mounted slidably and detachably in the shell, mounted slidably in the channels of the tracks of the module track assemble and having a plug formed on a rear end of the virtual synchronized mapping module and inserted into the module socket group.

2. The mobile digital video recorder as claimed in claim 1, further comprising a grip having a holder, two projections and a connecting part formed between the projections and the holder, wherein the main board has a front panel with protrusions selectively hooking the projections of the grip; and the virtual synchronized mapping module has a front panel with protrusions selectively hooking the projections of the grip.

3. The mobile digital video recorder as claimed in claim 2, wherein the shell has a body comprising a lower casing having a bottom panel and two inner side panels formed on two sides of the bottom panel; and an upper casing mounted above the lower casing and having a top panel; and two outer side panels formed on two sides of the top panel and attached respectively to outer sides of the inner side panels by fasteners; the tracks of the module track assembly are attached securely to bosses of the lower casing via fasteners.

4. The mobile digital video recorder as claimed in claim 3 further comprising a front cover, wherein the top panel of the upper casing has a front sheet; and the front cover covering the front opening of the shell and has a lock with a tongue driven by the lock and hooking the front sheet of the top panel.

5. The mobile digital video recorder as claimed in claim 4 further comprising a rear cover, wherein the rear panel of the lower casing has a rear sheet; and the rear cover covering the rear opening of the shell and has a lock with a tongue driven by the lock and hooking the rear sheet of the bottom panel.

6. The mobile digital video recorder as claimed in claim 5, wherein the body of the shell has an inner casing mounted between the upper and lower casings and having a partition; and two side wings formed on two sides of the partition and are attached respectively to inner sides of the inner side panels by fasteners; the tracks of the board track assembly are attached securely to the inner casing via fasteners; and the brackets of the rail assembly are attached securely to the side panels of the inner casing via fasteners.

7. The mobile digital video recorder as claimed in claim 6, wherein the side panels of the lower casing have multiple ears with screw holes; and the front panels are attached securely to the ears via screws to position the main board and the virtual synchronized mapping module securely.

8. A mobile digital video recorder comprising:
a hollow shell having a front opening and a rear opening;
a board track assembly mounted securely in the shell and having two tracks being opposite to each other, and each track having an elongated channel;
a power track assembly mounted securely in the shell and having two tracks being opposite to each other, and each track having an elongated channel;
a rail assembly mounted securely in the shell and having two brackets being opposite to each other, and each bracket having an elongated rib;
a signal converting board mounted in the rear opening of the shell and having a board socket group formed on an inner side of the signal converting board and corresponding to the board track assembly;

a power socket group formed on an inner side of the signal converting board and corresponding to the power track assembly;

a storage device socket group formed on an inner side of the signal converting board and corresponding to the rail assembly;

a storage device mounted slidably and detachably in the shell and having two pairs of flanges formed respectively on two sides of the storage device, two recesses defined respectively between the pairs of flanges and respectively engaging the elongated ribs of the brackets to slide the storage device along the rail assembly;

a plug formed on a rear end of the storage device and inserted into the storage device socket group;

a main board for signal processing mounted slidably and detachably in the shell, mounted slidably in the channels of the tracks of the board track assembly and having a plug formed on a rear end of the main board and inserted in to the board socket group;

a power board for converting power mounted slidably and detachably in the shell, mounted slidably in the channels of the tracks of the power track assembly and having a plug formed on a rear end of the power board and inserted into the power socket group;

a module track assembly mounted securely in the shell and having two tracks being opposite to each other, each track of the module track assembly having an elongated channel;

a module socket group formed on an inner side of the signal converting board and corresponding to the module track assembly;

a virtual synchronized mapping module for receiving global positioning signals mounted slidably and detachably in the shell, mounted slidably in the channels of the tracks of the module track assembly and having, a plug formed on a rear end of the virtual synchronized mapping module and inserted into the module socket group.

9. The mobile digital video recorder as claimed in claim 8, further comprising a grip having a holder, two projections and a connecting part formed between the projections and the holder, wherein the main board has a front panel with protrusions selectively hooking the projections of the grip; the power board has a front panel with protrusions selectively hooking the projections of the grip; and the virtual synchronized mapping module has a front panel with protrusions selectively hooking the projections of the grip.

10. The mobile digital video recorder as claimed in claim 9, wherein the shell has a body comprising a lower casing having a bottom panel and two inner side panels formed on two sides of the bottom panel; and an upper casing mounted above the lower casing and having a top panel; and two outer side panels formed on two sides of the top panel and attached respectively to outer sides of the inner side panels by fasteners; the tracks of the module track assembly and the power track assembly are attached securely to bosses of the lower casing via fasteners.

11. The mobile digital video recorder as claimed in claim 10 further comprising a front cover, wherein the top panel of the upper casing has a front sheet; and the front cover covering the front opening of the shell and has a lock with a tongue driven by the lock and hooking the front sheet of the top panel.

12. The mobile digital video recorder as claimed in claim 11 further comprising a rear cover, wherein the rear panel of the lower casing has a rear sheet; and the rear cover covering the rear opening of the shell and has a lock with a tongue driven by the lock and hooking the rear sheet of the bottom panel.

13. The mobile digital video recorder as claimed in claim 12, wherein the body of the shell has an inner casing mounted between the upper and lower casings and having a partition; and two side wings formed on two sides of the partition and are attached respectively to inner sides of the inner side panels by fasteners; the tracks of the board track assembly are attached securely to the inner casing via fasteners; and the brackets of the rail assembly are attached securely to the side panels of the inner casing via fasteners.

14. The mobile digital video recorder as claimed in claim 13, wherein the side panels of the lower casing have multiple ears with screw holes; and the front panels are attached securely to the ears via screws to position the main board and the virtual synchronized mapping module securely.

15. A mobile digital video recorder comprising:
- a hollow shell having a front opening and a rear opening, the front opening for slidably receiving a storage device, main board for signal processing, power board; and virtual synchronized mapping module, said rear opening having a signal converting board mounted therein, the signal converting board including sockets that face the interior of the hollow shell;
- said storage device, main board, power board, and virtual synchronized mapping module each having plugs for engagement within the sockets of the signal converting board when the storage device, memory board and power board are slidably received within said hollow shell;
- a sliding mechanism within said hollow shell for slidably receiving each of said storage device, main board, power board and virtual synchronized mapping module; and
- a gripping tool having a manual gripping portion and one or more projections for engaging at least one of said main board and power board to remove said respective boards from the hollow shell by gripping and sliding the respective boards along the sliding mechanism through said front opening.

\* \* \* \* \*